US008160110B2

(12) United States Patent
Tapie et al.

(10) Patent No.: US 8,160,110 B2
(45) Date of Patent: Apr. 17, 2012

(54) DEVICE FOR GENERATING A SAMPLED RAMP SIGNAL REPRESENTATIVE OF A SYNCHRONIZATION SIGNAL, AND DEVICE FOR ASSISTING THE RECONSTRUCTION OF A SYNCHRONIZATION SIGNAL, FOR A PACKET SWITCHING NETWORK

(75) Inventors: Thierry Tapie, Rennes (FR); Serge Defrance, Rennes (FR); Willem Lubbers, Cesson Sevigne (FR)

(73) Assignee: Thomson Licensing (FR)

( * ) Notice: Subject to any disclaimer, the term of this patent is extended or adjusted under 35 U.S.C. 154(b) by 864 days.

(21) Appl. No.: 12/008,960

(22) Filed: Jan. 15, 2008

(65) Prior Publication Data
US 2008/0170588 A1 Jul. 17, 2008

(30) Foreign Application Priority Data

Jan. 16, 2007 (FR) .................................... 07 52679

(51) Int. Cl.
*H04L 7/00* (2006.01)
(52) U.S. Cl. ....................................... 370/503; 375/354
(58) Field of Classification Search .................. 370/503, 370/505, 509, 520, 525, 526; 375/240.28, 375/354, 326; 327/76, 141, 156; 348/500, 348/516, 521, 525
See application file for complete search history.

(56) References Cited

U.S. PATENT DOCUMENTS

| 5,162,723 A | * | 11/1992 | Marzalek et al. | 324/76.19 |
| 6,079,020 A | * | 6/2000 | Liu | 726/15 |
| 7,020,791 B1 | * | 3/2006 | Aweya et al. | 713/400 |
| 7,386,080 B2 | * | 6/2008 | Paillet et al. | 375/355 |
| 2003/0174734 A1 | * | 9/2003 | Compton et al. | 370/503 |
| 2004/0257469 A1 | * | 12/2004 | Compton et al. | 348/500 |
| 2006/0146815 A1 | | 7/2006 | Tse | |

(Continued)

FOREIGN PATENT DOCUMENTS

| EP | 0624982 | 11/1994 |
| EP | 1471745 | 10/2004 |

(Continued)

OTHER PUBLICATIONS

Waidson, M: "Jitter-Reduzieirung in MPEG-2-Uebertragungssytemen" FKT Fernseh Und Kinotechnik, Fachverlag Schiele & Schon GMBH., Berlin, DE, vol. 56, No. 7, (Jul. 2002), pp. 392-294, XP001220612, ISSN: 1430-9947,* chapitre 4. Transport-induzierter PCR-jiter*, *chapitre 5. Messung von PCR-jitter*.

*Primary Examiner* — Aung S Moe
*Assistant Examiner* — Prince Mensah
(74) *Attorney, Agent, or Firm* — Jack Schwartz & Associates, PLLC

(57) ABSTRACT

A device is dedicated to assisting the reconstruction of synchronization signals, for example within an item of communication equipment of an IP network. This device comprises i) a phase-locked loop charged with reconstructing, on the basis of a second sampled ramp signal received, a reference clock signal and a second ramp signal identical to, and in phase with, that having been sampled, and ii) processing means charged with determining in a first sampled ramp signal received, representative of a synchronization signal to be reconstructed and each sample of which is associated with a sample of the second ramp signal corresponding to a determinable sampling period, the value which corresponds to the first sample of this first sampled ramp signal received as well as the sampling period corresponding to this value, and then to initialize with this value a synchronization counter which is synchronized with respect to the second reconstructed ramp signal, on the basis of the reconstructed reference clock signal.

11 Claims, 3 Drawing Sheets

FOREIGN PATENT DOCUMENTS

| | | |
|---|---|---|
| EP | 1613016 | 1/2006 |
| FR | 2898452 A | 9/2007 |
| FR | 2898453 | 9/2007 |
| WO | WO 03/010905 A | 2/2003 |

* cited by examiner

DEVICE FOR GENERATING A SAMPLED RAMP SIGNAL REPRESENTATIVE OF A SYNCHRONIZATION SIGNAL, AND DEVICE FOR ASSISTING THE RECONSTRUCTION OF A SYNCHRONIZATION SIGNAL, FOR A PACKET SWITCHING NETWORK

This application claims the benefit, under 35 U.S.C. §119, of European Patent Application No. 0752679 on 16 Jan. 2007.

TECHNICAL FIELD OF THE INVENTION

The invention relates to the synchronizing of equipment, and more precisely the transporting of synchronization signals via a communication network with a view to inter-synchronizing the equipment.

STATE OF THE ART

Certain equipment, such as for example video equipment (for example cameras or video recorders), is capable, once synchronized with respect to a reference time base, of providing synchronized data (defining for example video images). This synchronization is done by transmitting to the equipment a synchronization signal, which is for example called "Genlock" in the (nonlimiting) case of video equipment.

When the transmission of the synchronization signal is done by means of a dedicated cable, for example of coaxial type, no other signal flows in this cable. Consequently, the lag in transmitting the synchronization signal up to the various items of equipment to be synchronized is constant and devoid of jitter. On the basis of the synchronization signal received, each receiver item of equipment is able to reconstruct a timing clock (or reference time base or else reference clock signal) specific to its operation and guaranteeing that each data set (such as an image) that it generates is strictly in phase with each data set generated by each other item of equipment which is the subject of the same synchronization. Thus, two cameras can for example generate video contents which differ but are strictly in phase and in frequency with respect to one another. It is recalled that the phase and frequency of a clock constitute what is called its timing.

When the equipment is connected to a communication network introducing transmission lags and jitters that vary from one item of equipment to another, as is the case in particular for a so-called packet switching network, such as a wire-based (Ethernet) or non-wire-based IP network, it is no longer possible to transmit the synchronization signal. A sampled ramp signal which is representative of the synchronization signal is then transmitted on the network part.

More precisely, on the send side, information making it possible to recover a reference clock signal and content pips (for example image pips) is extracted from the synchronization signal (for example Genlock), which is delivered by a master item of equipment. The reference clock signal supplies first and second counters delivering first and second synchronous ramp signals representative of the number of ticks of the reference clock signal that have been delivered respectively since the last recovered content pip and since a last reference pip. The value of the first counter is set to zero each time that a content pip is recovered. A third counter meters the number of zero settings of the first ramp signal and generates a reference pip each time that this number is equal to a chosen threshold. The value of the second counter (generally termed "PCR" (for "Program Clock Reference")) is set to zero each time that a reference pip is generated. The second ramp signal is sampled according to a sampling frequency (which is generally provided by the network) and the resulting samples are transmitted via the network to the receiver items of equipment by means of frames of packet(s).

It will be noted that in the case of video contents, the period of the content pips is for example equal to 40 ms in the case of a 625 lines standard.

On the receive side, the samples received via the network are used to synchronize a phase-locked loop (or PLL) and therefore to reconstruct the starting reference clock signal. More precisely, the phase-locked loop reconstructs the reference clock signal on the basis of the second sampled ramp signal transmitted, then it reconstructs a second ramp signal identical to, and in phase with, that having been sampled send side. Processing means are charged with initializing the value of a synchronization counter, synchronous with respect to the second reconstructed ramp signal, on the basis of the latter and of the reconstructed reference clock signal.

The second ramp signals (PCR), sampled send side at regular intervals (sampling period) arrive at irregular intervals on receive side, predominantly because of the jitter which is introduced by transporting them (for example over IP). These PCR signals are again taken into account at regular intervals (Tsamp) on the receive side. The phase-locked loop (PLL) is charged with filtering the jitter related to the sampling instant of the PCR counting ramp by the sampling signal of period Tsamp, so that a second ramp signal which evolves strictly in a manner synchronous with the second ramp signal (PCR) generated send side is retrieved as output from the counter (receive side). The inaccuracy between the sampling instants on send side and on receive side is absorbed by the PLL whose bandwidth is appropriate. Therefore the timing of the reference clock signal reconstructed receive side is identical to that generated on send side, both in frequency and in phase.

Once the timing has been reconstructed, it is necessary to reconstruct the first ramp signal and synchronize it with respect to the second reconstructed ramp signal. Accordingly, the same zero-setting period is used as that used on the send side (for example 40 ms). Then, each time the first ramp signal is set to zero a content pip is generated, and the initial synchronization signal is reconstructed on the basis of the content pips and the reference clock signals reconstructed.

SUMMARY OF THE INVENTION

The reconstruction of the first ramp signal cannot currently be done unless the period T2 of the second ramp signal (PCR) is an integer multiple m of the period T1 of the said first ramp signal, or T2=m*T1. Consequently, to be able to begin to reconstruct the first ramp signal, it is necessary to wait receive side for the first setting to zero of the counter which is used to reconstruct the second ramp signal. Such a wait may in the worst of cases be almost equal to the period T2 of the second ramp signal (PCR). Now, the person skilled in the art is aware that for reasons related to the lock-on time of the PLL receive side, the duration of the period T2 may be very large. For example, in the presence of a period T1 equal to 40 ms (video content), m must be of the order of 2000, so that the waiting time to initialize the counter used to reconstruct the first ramp signal may be equal to about 80 seconds, this being much too long.

To reduce this waiting time, it would be possible for example to decide to begin transmitting (send side) the second ramp signal when it is close to its maximum (that is to say shortly before it is reset to zero). But, this would involve near simultaneous commencement of sending and receiving, which almost never happens in the utilization phase.

The aim of the invention is therefore to reduce as far as possible the waiting time necessary for the initialization of the counter which is used to reconstruct the first ramp signal in a remote item of communication equipment connected to a packet switching network, for example of IP type, including when the period T2 of the second ramp signal (PCR) is not an integer multiple of the period T1 of the first ramp signal.

For this purpose, the invention proposes first of all a device, dedicated to the generation of sampled ramp signals representative of synchronization signals, and, on the one hand, charged with recovering in synchronization signals received a reference clock signal and content pips, and with delivering first and second synchronous ramp signals representative of the number of ticks of the reference clock signal that have been delivered respectively since the last recovered content pip and since a last reference pip, each content pip triggering the setting to zero of the first ramp signal and each reference pip being defined when the number of zero settings of the first ramp signal is equal to a chosen threshold, and on the other hand, comprising a sampler charged with sampling the second ramp signal according to a sampling frequency so that the resulting samples can be transmitted in frames of packet(s).

This generating device is characterized in that its sampler is furthermore charged with sampling the first ramp signal according to the sampling frequency and with inter-associating the samples of the first and second ramp signals which correspond to one and the same sampling period so that the samples of the first and second ramp signals can be transmitted in an associated manner in frames of packet(s).

The sampler can also be charged with inter-associating the samples of the first and second ramp signals which correspond to one and the same sampling period so that the associated samples of the first and second ramp signals are integrated within one and the same packet.

Additionally, the generating device can possibly comprise network interface means connected to the output of the sampler and charged with constructing the packets of the frames to be transmitted.

The invention also proposes a first item of communication equipment, for a packet switching communication network suitable for transmitting frames of packet(s), and equipped with a generating device of the type of that presented above.

The invention also proposes a first device intended to assist the reconstruction of synchronization signals and characterized in that it comprises:

a phase-locked loop charged with reconstructing, on the basis of a second ramp signal transmitted by a remote item of equipment (after sampling according to a chosen sampling frequency identical to, and in phase with, a local sampling frequency), a reference clock signal and a second ramp signal identical to, and in phase with, that having been sampled, and processing means charged with determining in a first ramp signal, transmitted by the remote item of equipment (after sampling according to the sampling frequency), representative of a synchronization signal to be reconstructed and each sample of which is associated with a sample of the second ramp signal corresponding to a determinable sampling period, at least the value corresponding to the first sample of the first sampled ramp signal received and the sampling period corresponding to this value, and then with initializing with this determined value a synchronization counter, synchronized with respect to the second reconstructed ramp signal, on the basis of the reconstructed reference clock signal.

The first device for assisting the reconstruction of synchronization signals according to the invention can comprise other characteristics which can be taken separately or in combination, and in particular:

it can comprise control means charged with defining a content pip during each zero setting of the synchronization counter;

it can comprise, firstly, at least one auxiliary counter synchronous with the synchronization counter and whose current value is representative of chosen subsets of a content, secondly, processing means charged with deducing from the current value of the first counter the corresponding value of the auxiliary counter, and with setting the value of the auxiliary counter to zero when the current value of the first counter corresponds to the maximum value that this auxiliary counter can take, and thirdly, control means charged with defining a synchronization pip during each detection of a setting to zero of the auxiliary counter, this synchronization pip then serving as starting instant for reconstructing the synchronization signal;

it can comprise generation means charged with reconstructing synchronization signals on the basis of the content pips and/or synchronization pips defined and of the local reference clock signal.

The invention also proposes a second device intended to assist the reconstruction of synchronization signals and comprising a phase-locked loop charged with reconstructing, on the basis of a second ramp signal transmitted by a remote item of equipment (after sampling according to a chosen sampling frequency identical to, and in phase with, a local sampling frequency), a reference clock signal and then a second ramp signal identical to, and in phase with, the second ramp signal before the sampling, the latter itself being synchronized with a first ramp signal representative of synchronization signals to be reconstructed.

This second assistance device is characterized in that it comprises processing means charged with determining at least the value which corresponds to the first sample of the second sampled ramp signal received and the sampling period corresponding to this value, and then with deducing from this value an initialization value representative of a part of the first ramp signal corresponding to this determined sampling period, and with initializing with this initialization value a synchronization counter, synchronized with respect to the reconstructed ramp signal, on the basis of the reconstructed reference clock signal.

The second device for assisting the reconstruction of synchronization signals according to the invention can comprise other characteristics which can be taken separately or in combination, and in particular:

it can comprise control means charged with defining a content pip during each zero setting of the synchronization counter;

it can comprise, firstly, at least one auxiliary counter synchronous with the synchronization counter and whose current value is representative of chosen subsets of a content, secondly, processing means charged with deducing from the current value of the first counter the corresponding value of the auxiliary counter, and with setting the value of the auxiliary counter to zero when the current value of the first counter corresponds to the maximum value that this auxiliary counter can take, and thirdly, control means charged with defining a synchronization pip during each detection of a setting to zero of the auxiliary counter, this synchronization pip then serving as starting instant for reconstructing the synchronization signal;

it can comprise generation means charged with reconstructing synchronization signals on the basis of the content pips and/or synchronization pips defined and of the local reference clock signal.

The invention also proposes a second item of communication equipment, for a packet switching communication network suitable for transmitting packet frames, and equipped with a first or second device for assisting the reconstruction of synchronization signals of the type of that presented above.

The invention is particularly well adapted, although in a non-exclusive manner, to the synchronization by network of video equipment or the synchronization by network of industrial equipment, such as for example robots on a production line. In the latter application, a sender independently synchronizes at least two robots which execute different tasks on one and the same object. These robots must comply with temporally precise orders so as not to get in each other's way. It is then possible to envisage that the orders specific to each of the robots be decoded on the basis of particular values of the PCR ramp signal. However, it is necessary that the sequence of order to be followed be repetitive about every 80 seconds, for example.

BRIEF DESCRIPTION OF THE DRAWINGS

Other characteristics and advantages of the invention will be apparent on examining the detailed description hereinafter, and the appended drawings, in which.

The appended drawings will be able not only to serve to supplement the invention, but also to contribute to its definition, if appropriate.

DETAILED DESCRIPTION

The object of the invention is to make it possible to reduce the waiting time necessary for the initialization of the synchronization counter which is used to reconstruct a first ramp signal in a remote item of communication equipment connected to a packet switching network.

In what follows, it is considered by way of nonlimiting example that the packet switching communication network is a wire-based local network (for example of Ethernet type (IEEE 802.3)) offering IP ("Internet Protocol") access. But, the invention is not limited to this type of network. It relates indeed to any type of packet switching communication network capable of transmitting frames of packet(s) (possibly of IP type) by wire or by waves.

The invention relates not only to the items of (communication) equipment situated on the receive side (Rx) and needing to reconstruct synchronization signals to synchronize itself or to allow at least one other item of equipment to synchronize itself, but also to the remote item of equipment which is situated on the send side (Tx) and which generates sampled ramp signals representative of the synchronization signals which have to be reconstructed on the receive side.

The equipment to which the invention relates is, for example, servers, communication interfaces (for example IP/analogue), industrial equipment (such as robots) or equipment allowing the viewing of video images filmed by a camera and which have to be synchronized with one another (including with the camera), and in particular fixed or mobile telephones, fixed or portable computers, personal digital assistants (or PDAs), video recorders and video cameras (or any other studio video equipment).

In what follows, it is considered by way of nonlimiting example that the synchronization signals are intended to synchronize video equipment delivering video contents (or images) according to a predefined period (T1), for example equal to 40 ms (corresponding to a 625-line standard). In this case, the synchronization signals are generally called "Genlock". But, the invention is not limited to this type of application. It relates indeed to all situations in which synchronization signals have to be transmitted to remote equipment (to be synchronized) via a packet switching communication network.

Figure 1:
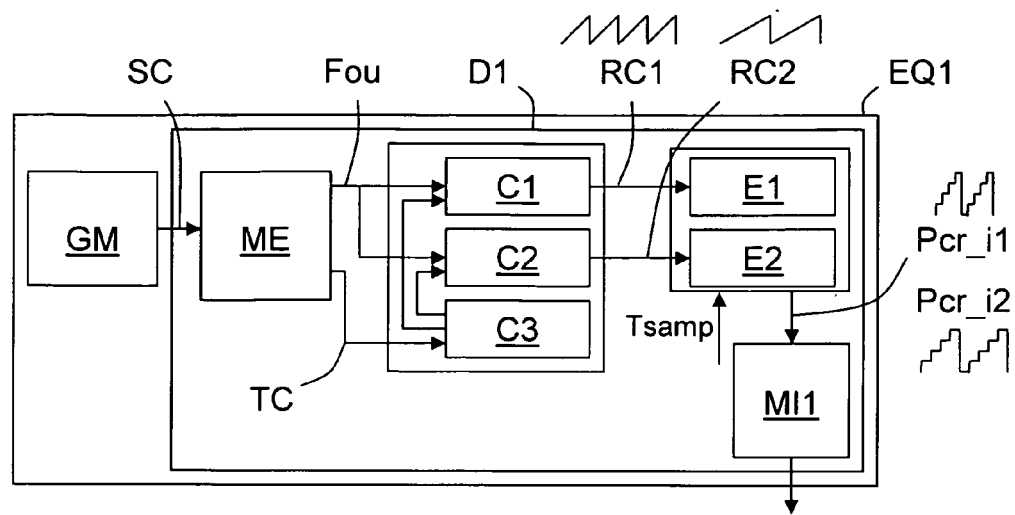
FIG. 1 illustrates in a very schematic and functional manner an exemplary item of communication equipment comprising an exemplary embodiment of a device for generating sampled ramp signals according to the invention.

Reference will firstly be made to FIG. 1 to describe an item of (communication) equipment EQ1 dedicated to the generation of sampled ramp signals (also called counter signals). As illustrated, such an item of equipment EQ1 comprises a device for generating sampled ramp signals D1 according to the invention. It will be noted that in a variant the device (for generating sampled ramp signals) D1 can be an element (such as for example an electronic card) external to the item of equipment EQ1 but coupled to the latter.

A device (for generating sampled ramp signals) D1 is first of all charged with recovering in synchronization signals SC received a reference clock signal Fout and periodic content pips TC.

Each synchronization signal (here Genlock) is generated by a master generating module GM which forms part of the item of equipment EQ1 (as illustrated in a nonlimiting manner), or of another item of equipment connected to its own item of equipment EQ1 by means of a cable, for example of coaxial type.

A content pip is an information item which signals the start of a content (here a video image).

The recovery of a reference clock signal Fout and of content pips TC on the basis of a synchronization signal SC is conventionally done by means of an extraction module ME.

The device D1 is also charged with delivering first RC1 and second RC2 synchronous ramp signals on the basis of the recovered reference clock signal Fout and content pips TC.

The first ramp signal RC1 is representative at each instant of the number of ticks of the reference clock signal Fout which have been delivered since the last content pip TC recovered by the extraction module ME. For example, a first counter C1 is used to generate the first ramp signal RC1 on the basis of the recovered reference clock signal Fout. At each clock signal Fout, the value of the first counter C1 is therefore incremented by one unit.

The second ramp signal RC2 is representative at each instant of the number of ticks of the reference clock signal Fout which have been delivered since a last reference pip. For example, a second counter C2 is used to generate the second ramp signal RC2 on the basis of the recovered reference clock signal Fout. At each clock signal Fout, the value of the second counter C2 is therefore incremented by one unit.

Each content pip TC triggers the setting to zero of the first ramp signal RC1. For example, a third counter C3 is used to meter each content pip TC recovered by the extraction module ME, and to set the first counter C1 to the value zero each time that a content pip TC is recovered and therefore metered. This third counter C3 is additionally charged with defining a reference pip each time the number of zero settings of the first counter C1 (and therefore of the value of the first ramp signal RC1) is equal to a chosen threshold (m) (for example m=2048).

In what follows, the reference T1 denotes the period of the first ramp signal RC1 and the reference T2 denotes the period of the second ramp signal RC2.

The device also comprises first E1 and second E2 sampling modules charged with sampling respectively the first RC1 and second RC2 ramp signals (delivered by the first C1 and second C2 counters) according to a sampling frequency Fsamp.

The sampling frequency Fsamp (or period Tsamp) is defined by what the person skilled in the art generally calls "sampling pips" which are transmitted periodically (according to the said sampling period) to all the communication equipment (or stations) of the (or attached to the) network and which are the same for all this equipment. A sampling pip defines a sampling instant. It can also, when it constitutes a frame pip, as in the case of the IEEE 802.16-D standard, define for each item of equipment (or station) the moment at which it can send or receive a frame. This type of sampling pip is for example (and non-limitingly) defined by the IEEE 1588 standard initially dedicated to Ethernet (wire-based) networks and recently extended to non-wire-based networks (of all types). It is used with a clock synchronization protocol called PTP (for "Precision Time Protocol"). It will be noted that the invention applies whatever type of sampling pip is used.

For example Tsamp is equal to 5 ms.

The output of the first sampling module E1 delivers a first sampled ramp signal (or first counter signal) Pcr_i1, and the output of the second sampling module E2 delivers a second sampled ramp signal (or second counter signal) Pcr_i2.

According to the invention, the sampler, which comprises the first E1 and second E2 sampling modules (synchronized by their clamping to the recovered reference clock signal Fout), is charged with inter-associating the samples of the first Pcr_i1 and second Pcr_i2 ramp signals which correspond to one and the same sampling period Tsamp, before they are transmitted within frames of packet(s). This transmission is done by means of a network interface module MI1 which forms part either of the device D1 (as illustrated in FIG. 1) or of the item of equipment EQ1. Thus, the samples of the first Pcr_i1 and second Pcr_i2 ramp signals are integrated in an associated manner by the network interface module MI1 into packets (here IP) which are thereafter integrated into frames intended for the remote items of equipment EQ2 to be synchronized.

This integration in associated form can for example be done by simultaneously transmitting in one and the same packet the sample of the first ramp signal Pcr_i1 corresponding to a given sampling period Tsamp and the sample of the second ramp signal Pcr_i2 corresponding to this same sampling period Tsamp.

The extraction module ME, the counters C1, C2 and C3 and the sampling modules E1 and E2 are preferably embodied in the form of electronic circuits ("hardware"). But, it is possible to envisage that at least one of them is embodied in the form of a combination of software modules ("software") and electronic circuits ("hardware").

Figure 2:
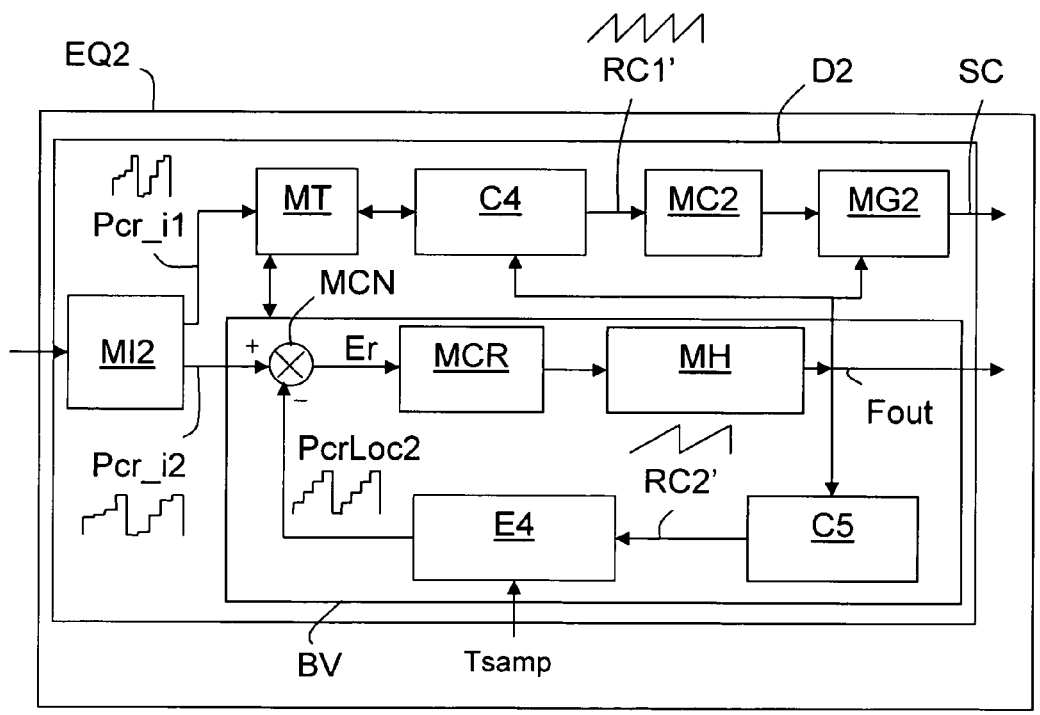
FIG. 2 illustrates in a very schematic and functional manner an exemplary item of communication equipment comprising a first exemplary embodiment of a device for assisting the reconstruction of synchronization signals according to the invention.

Reference will now be made to FIG. 2 to describe a first device for assisting the reconstruction of synchronization signals D2 according to the invention. As illustrated in FIG. 2, such a device D2 can be installed in an item of (communication) equipment EQ2 needing synchronization signals or connected by wire to at least one other item of equipment needing synchronization signals. In the latter case, the device D2 can form part or constitute a network interface, for example of IP/analogue type.

It will be noted that in a variant the device D2 can be an element (such as for example an electronic card) external to the item of equipment EQ2 but coupled to the latter.

A first device (for assisting the reconstruction of synchronization signals) D2 comprises at least one processing module MT, a phase-locked loop (or PLL) BV and a first counter C4.

As illustrated in FIG. 2, the phase-locked loop (PLL) BV conventionally comprises a comparison module MCN, a correction module MCR, a clock module MH, a second counter C5 and a sampler E4.

The comparison module MCN comprises an input receiving the samples of the second ramp signal Pcr_i2 from a network interface module MI2. More precisely, the latter receives the frames of packet(s) (here IP), analyses the contents thereof and transmits the samples of the second ramp signal Pcr_i2 to the comparison module MCN as well as, as will be seen further on, at least the first sample of the first ramp signal Pcr_i1 to the processing module MT. As illustrated in FIG. 2, the network interface module MI2 can form part of the assistance device D2. But, in a variant, it could be external to the assistance device D2 while being coupled to the latter.

This comparison module MCN is charged with comparing the second sampled ramp signal Pcr_i2 (originating from a device D1) with a local sampled ramp signal PcrLoc2, so as to deliver on an output a comparison signal Er which represents the result of this comparison. As illustrated in FIG. 2, the comparison module MCN can for example be embodied in the form of a comparator subtracting from the value of the second sampled ramp signal Pcr_i2 the value of the second sampled ramp signal PcrLoc2 and delivering on its output a comparison signal (or error signal) Er equal to the result of this subtraction (Er=Pcr_i2−PcrLoc2).

It will be understood that in the PLL BV, the comparison signal (or error signal) Er is equal to zero (0) during a phase of lock-on to input signals having very little jitter. For an input signal comprising jitter, the output of the PLL BV is jitterless. In this case, the value of the error Er is the value of the jitter rejected.

The correction module MCR is charged with determining a configuration value which must be applied by the clock module MH, on the basis of the comparison signal Er delivered by the comparison module MCN.

The correction module MCR implements for example a so-called Zdan procedure making it possible to have a zero speed error within the meaning of slaving controls. But other procedures known to the person skilled in the art can be implemented.

The clock module MH is charged with reconstructing the reference clock signals exhibiting the same reference clock frequency Fout as that used on the send side by D1. It takes the form for example of a digital VCO ("Voltage Controlled Oscillator") implementing a so-called accumulation principle.

The output of the clock module MH supplies the item of equipment EQ2, a first counter C4 and the second counter C5 of the PLL BV with the reconstructed reference clock signal Fout.

The second counter C5 is charged with generating and delivering on an output a periodic reconstructed ramp signal RC2' representative at each instant of the number of reference clock signals Fout which have been delivered by the clock module MH since its last reset to zero. Stated otherwise, at each reference clock signal Fout received from the clock module MH, the value of the second counter C5 is incremented by one unit. When this value of the second counter C5 reaches a predefined maximum value (strictly identical to that used by the second counter C2 of the device D1), it is reset to zero and a new period (T2) starts.

The sampler E4 is charged with sampling the second reconstructed ramp signal RC2' (delivered by the output of the second counter C5) according to the sampling frequency Fsamp which is identical to that used previously by the device D1, so as to constitute and deliver on an output a second local sampled ramp signal PcrLoc 2 which is used by the comparison module MCN.

Once the PLL has locked on, the second reconstructed sampled ramp signal PcrLoc2 is identical to, and in phase with, the second sampled ramp signal Pcr_i2 generated by the device D1.

The first counter C4 (also called synchronization counter) is initialized with an initialization value V1 which is equal to the value represented by the first sample of the first sampled ramp signal received by the network interface module MI2.

Once the PLL has locked on and therefore once the reference clock signal Fout has been reconstructed by the PLL BV, the first counter C4 increments its initialization value by one unit at each clock tick of the said reference clock signal Fout. It then delivers on an output a periodic reconstructed ramp signal RC1' representative at each instant of the number of reference clock signals Fout which have been delivered by the clock module MH (of the PLL BV) since a last reset to zero.

It will be noted that once initialized, the first counter resets its value to zero (0) when it reaches a predefined maximum value (strictly identical to that used for the first counter C1 of the device D1), thereby inducing the start of a new counting period (T1).

Additionally, it will also be noted that once the PLL BV has locked on, the first reconstructed ramp signal RC1' is in phase with the second reconstructed ramp signal RC2'. It is therefore perfectly identical to, and in phase with, the first ramp signal RC1 generated by the device D1, since once PLL lock-on has been performed the second reconstructed ramp signal RC2' is in phase with the second ramp signal RC2 (generated by the device D1), itself perfectly in phase by definition with the first ramp signal RC1. The first reconstructed ramp signal RC1' can therefore be used to reconstruct the synchronization signal SC on the basis of which the first ramp signal RC1 was defined on the send side.

The initialization value V1 is provided to the first counter C4 by the processing module MT. The latter is indeed coupled to the network interface module MI2 and therefore receives from it the samples of the first ramp signal received Pcr_i1. It can thus determine at least the value V1 which corresponds to the first sample of the first sampled ramp signal Pcr_i1 received and the sampling period to which this first sample (and therefore this value V1) corresponds. The processing module MT then constrains the first counter C4 to start counting on the basis of the value V1 and clamped to the sampling period which corresponds to the first sample of the first ramp signal received Pcr_i1 (see FIG. 3). It is this clamping which drives the synchronization of the first counter C4 with respect to the second reconstructed ramp signal RC2'

The output of the first counter C4 preferably supplies with the first ramp signal RC1' a control module MC2 which is charged with defining a content pip TC' each time the said first counter C4 is set to zero. As illustrated in FIG. 2, this control module MC2 preferably forms part of the device D2. But, it could also be external to the device D2 while being coupled to the output of its first counter C4.

Additionally, and as illustrated in FIG. 2, the device D2 can also comprise a generating module MG2 charged with reconstructing the synchronization signals SC (initially generated by the master generating module GM send side (Tx)) on the basis of the content pips TC' (defined by the control module MC2) and of the reference clock signal Fout. This generating module MG2 could also be external to the device D2 while being coupled to the output of its control module MC2.

Figure 3:
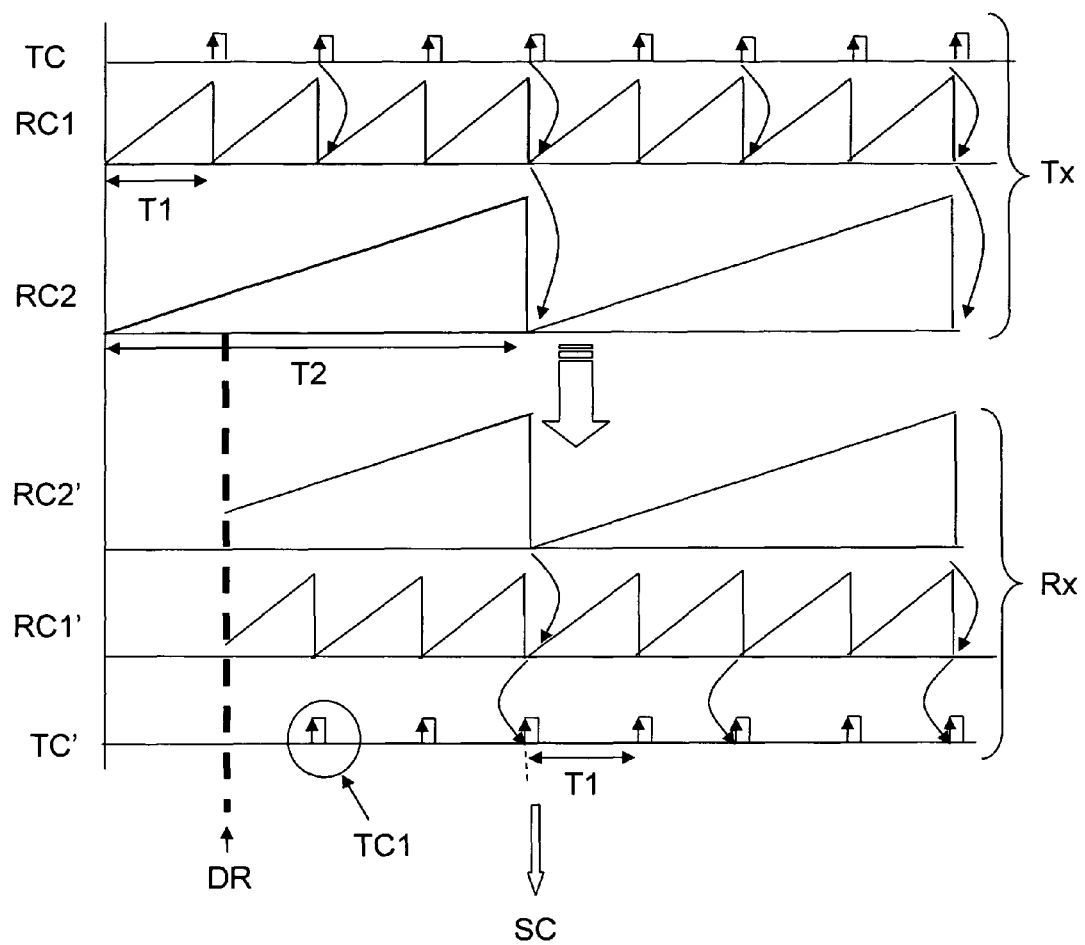
FIG. 3 illustrates exemplary time charts of content pips (TC) send side (Tx), of first ramp signals (RC1) send side (Tx), of second ramp signals (RC2) send side (Tx), of reconstructed content pips (TC') receive side (Rx), of first reconstructed ramp signals (RC1') receive side (Rx), and of second reconstructed ramp signals (RC2') receive side (Rx)

FIG. 3 illustrates in a nonlimiting manner time charts (timing diagrams) considered on the send side (Tx) and on the receive side (Rx). These time charts correspond to a (nonlimiting) situation in which the period T2 of the second ramp signal RC2 (RC2') is an integer multiple of the period T1 of the first ramp signal RC1 (RC1'), i.e. T2=m*T1. But, the invention applies in the same manner to situations in which the period T2 of the second ramp signal RC2 (RC2') is not an integer multiple of the period T1 of the first ramp signal RC1 (RC1').

More precisely, in FIG. 3:

- the signal "TC" corresponds to the content pips TC which are deduced from the synchronization signal SC by the extraction module ME of the device D1,
- the signal "RC1" corresponds to the first ramp signal RC1 which is generated by the first counter C1 of the device D1 on the basis of the ticks of the reference clock signal and of the content pips TC,
- the signal "RC2" corresponds to the second ramp signal RC2 which is generated by the second counter C2 of the device D1 on the basis of the ticks of the reference clock signal and of the successive zero settings of the first ramp signal RC1,
- the signal "RC2" corresponds to the second ramp signal RC2' which is reconstructed by the second counter C5 of the device D2 on the basis of the second sampled ramp signal Pcr_i2 received. The reference DR demarcates the start of reception by the device D2 (or D2') of the second sampled ramp signal Pcr_i2 and (here) of the associated first sampled ramp signal Pcr_i1,
- the signal "RC1" corresponds to the first ramp signal RC1' which is reconstructed by the first counter C4 of the device D2 on the basis of the value V1, of the first sample of the first ramp signal Pcr_i1,
- the signal "TC" corresponds to the content pips TC' which are deduced from the first ramp signal RC1' (delivered by the first counter C4) by the control module MC2 of the device D2. The reference TC1 demarcates the first valid content pip onto which it is possible to clamp temporally so as to begin reconstruction of the synchronization signal SC.

It will be understood that the synchronization signal SC is reconstructed thereafter by the generating module MG2 on the basis of the content pips TC' reconstructed by the control module MC2 of the device D2 and of the reference clock signal Fout.

It is possible to envisage a variant of the embodiment of the first device D2, described above with reference to FIG. 2. In this variant (not illustrated), the first device D2 comprises a complementary module comprising at least one auxiliary counter which is synchronous with the first counter (synchronization counter) C4 and which exhibits a value which represents the number of subsets of a content taken into account since a last synchronization pip. For example, the subset is one of the (625) lines defining an image, and in this case the auxiliary counter is a line counter. But, the subset could also be one of the pixels of an image line, and in this case the auxiliary counter is a pixel counter. In this case, to a given value of the first counter C4 there corresponds a unique value of a line counter and/or a unique value of a pixel counter.

In this variant, the processing module MT can for example be charged with deducing from the current value of the first counter C4 the corresponding value of each auxiliary counter having regard to the fact that the duration of a content is an integer multiple of the duration of a subset. Thus, as soon as the processing module MT detects that the current value of the first counter C4 corresponds to the maximum value that an auxiliary content subset counter can take, it sets the value of this auxiliary counter to zero. Each zero setting is for example detected by the control module MC2 which then defines a synchronization pip onto which the first device D2 can clamp temporally so as to begin reconstruction of the synchronization signal SC. This makes it possible to yet further reduce the duration of the initialization waiting time. But, it will be noted that this duration cannot be less than the duration of the sampling period Tsamp.

Figure 4:
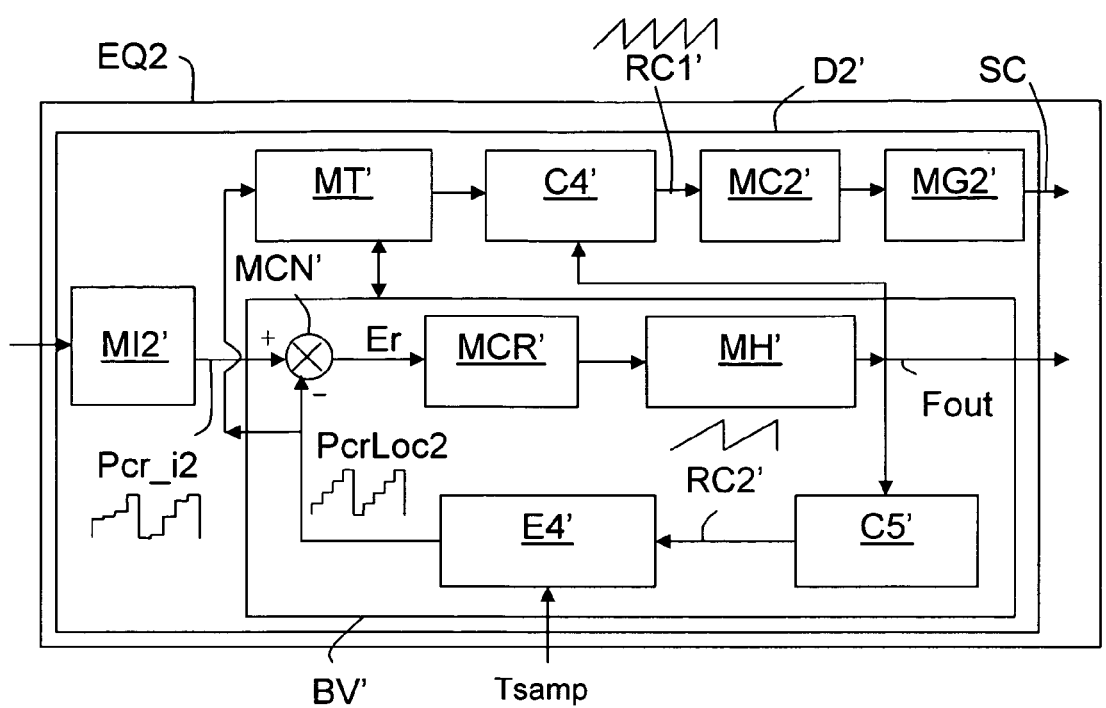
FIG. 4 illustrates in a very schematic and functional manner an exemplary item of communication equipment comprising a second exemplary embodiment of a device for assisting the reconstruction of synchronization signals according to the invention.

Reference will now be made to FIG. 4 to describe a second device for assisting the reconstruction of synchronization signals D2' according to the invention. As illustrated in FIG. 4, such a second device D2' can be installed in an item of (communication) equipment EQ2 needing synchronization signals or connected by wire to at least one other item of equipment needing synchronization signals. In the latter case, the second device D2' may form part or constitute a network interface, for example of IP/analogue type.

It will be noted that in a variant the second device D2' may be an element (such as for example an electronic card) external to the item of equipment EQ2 but coupled to the latter.

A second device (for assisting the reconstruction of synchronization signals) D2' comprises at least one processing module MT' and a phase-locked loop (or PLL) BV'.

It is important to note to that the second device D2' is intended to process solely second sampled ramp signals generated by a device for generating sampled ramp signals of conventional type and not by a device for generating sampled ramp signals D1 according to the invention.

It is recalled that a device for generating sampled ramp signals of conventional type comprises:
- an extraction module charged with recovering a reference clock signal Fout and content pips TC on the basis of a synchronization signal SC (here Genlock) generated by a master generating module,
- a first counter for generating the first ramp signal RC1 on the basis of the recovered reference clock signal Fout,
- a second counter for generating the second ramp signal RC2 on the basis of the recovered reference clock signal Fout,
- a third counter i) for metering each content pip TC recovered by the extraction module, ii) for setting to the value zero the first counter each time a content pip TC is recovered and therefore metered, and iii) for defining a reference pip each time the number of zero settings of the first counter (and therefore of the value of the first ramp signal RC1) is equal to a chosen threshold (m) (for example m=2048),
- a sampler for sampling the second ramp signal RC2 (delivered by the second counter) according to a sampling frequency Fsamp, and thus delivering a second sampled ramp signal Pcr_i2,
- a possible network interface module MI1 for integrating into packets the samples of the second ramp signal Pcr_i2, and transmitting these packets in frames destined for the remote items of equipment EQ2.

As illustrated in FIG. 4, the phase-locked loop (PLL) BV' is supplied with second sampled ramp signals Pcr_i2 by a network interface module MI2'. The latter receives the frames of packet(s) (here IP), analyses the contents thereof and transmits the samples of the second ramp signal Pcr_i2 to the comparison module MCN'. As illustrated in FIG. 4, the network interface module MI2 can form part of the assistance device D2'. But, in a variant, it could be external to the assistance device D2' while being coupled to the latter.

The phase-locked loop (PLL) BV' comprises, as in the previous exemplary embodiment (illustrated in FIG. 2), a comparison module MCN', a correction module MCR', a clock module MH', a second counter C5' and a sampler E4'. Its operation is identical to that of the phase-locked loop (PLL) BV of the first device D1. Consequently, the operation of the comparison module MCN' is identical to that of the comparison module MCN, the operation of the correction module MCR' is identical to that of the correction module MCR, the operation of the clock module MH' is identical to that of the clock module MH, the operation of the second counter C5' is identical to that of the second counter C5, and the operation of the sampler E4' is identical to that of the sampler E4.

It is recalled that the clock module MH' is charged with reconstructing the reference clock signals exhibiting the same reference clock frequency Fout as that used on the send side. Its output supplies the item of equipment EQ2, a first counter C4' and the second counter C5' of the PLL BV' with the reconstructed reference clock signal Fout.

The second device D2' comprises a processing module MT' charged with determining at least the value V1' which corresponds to the first sample of the second reconstructed sampled ramp signal PcrLoc2 as well as the sampling period which corresponds to this value V1'. Accordingly, and as illustrated in FIG. 4, the processing module MT' can for example analyse at least the first sample of the second reconstructed ramp signal PcrLoc2 (delivered by the sampler E4') so as to determine at least the value V1' that this first sample represents as well as the sampling period which corresponds to this value V1'.

Once the processing module MT' has determined the value V1', it deduces from this value an initialization value V2 which corresponds to the sampling period for the determined value V1' and which, on the one hand, is representative of the value taken by a part of the first ramp signal RC1 send side (and therefore of the synchronization signals to be reconstructed), and on the other hand, corresponds to this determined sampling period. In order to be able to deduce the value of a part of the first ramp signal RC1 which is synchronized with the value of a part of the second ramp signal RC2, it is absolutely necessary that the duration T2 of the ramp of the second ramp signal RC2 be equal to a chosen value K multiplied by the duration T1 of the ramp of the first ramp signal RC1. This value K is for example equal to 2048 in the case of a video content and when T1 is equal to 40 ms. In this case, there therefore does indeed exist a known correspondence between the value of the sample of a second ramp signal Pcr_i2 for a given sampling period and the value of the part of the first associated ramp signal RC1 (send side) which corresponds to this same given sampling period. Use is made here of the fact that the duration T2 must necessarily be modulo K times T1.

Once the processing module MT' has determined the initialization value V2, it initializes with this initialization value V2 the first counter (or synchronization counter) C4', which is synchronized with respect to the second reconstructed ramp signal RC2', because they use, or are constructed with, the reconstructed reference clock signal Fout.

Stated otherwise, the processing module MT' constrains the first counter C4' to start counting on the basis of the value V2, clamped to the sampling period which corresponds to the first sample of the second ramp signal received Pcr_i2. This clamping drives the synchronization of the first counter C4' with respect to the second reconstructed ramp signal RC2'. From the instant of the clamping, the first counter C4' switches to autonomous mode. It increments its start value V2 by one unit at each tick of the reconstructed reference clock signal Fout, and each time its value reaches a predefined maximum value (strictly identical to that used for the first counter C1 of the device D1), it sets its value to zero and starts a new counting period of duration T1.

The output of the first counter C4' preferably supplies with the first reconstructed ramp signal RC1' a control module MC2' which is charged with defining a content pip TC' each time the said first counter C4' is set to zero. As illustrated in FIG. 4, this control module MC2' preferably forms part of the second device D2'. But, it could also be external to the second device D2' while being coupled to the output of its first counter C4'.

Additionally, and as illustrated in FIG. 4, the second device D2' can also comprise a generating module MG2' charged with reconstructing the synchronization signals SC (initially generated by the master generating module GM send side (Tx)) on the basis of the content pips TC' (defined by the control module MC2') and of the reference clock signal Fout. This generating module MG2' could also be external to the second device D2' while being coupled to the output of its control module MC2'.

The time charts illustrated in FIG. 3 also apply to the second device D2'.

As in the case of the first device D2, the second device D2' may possibly comprise a complementary module comprising at least one auxiliary counter synchronous with the first counter (synchronization counter) C4' and exhibiting a value representing the number of subsets of a content taken into account since a last synchronization pip. In this case, the processing module MT' can for example deduce from the current value of the first counter C4' the corresponding value of each auxiliary counter (line or pixel counter, for example). Thus, as soon as the processing module MT' detects that the current value of the first counter C4' corresponds to the maximum value that an auxiliary content subset counter can take, it sets the value of this auxiliary counter to zero. Each zero setting is for example detected by the control module MC2' which then defines a synchronization pip onto which the second device D2' can temporally clamp so as to begin reconstruction of the synchronization signal SC.

The clock module MH (or MH'), the counters C4 (or C4') and C5 (or C5'), the sampling module E4 (or E4'), and the possible control module MC2 (or MC2') and generating module MG2 (or MG2') are preferably embodied in the form of electronic circuits ("hardware"). But, it is possible to envisage that at least one of them is embodied in the form of a combination of software modules ("software") and electronic circuits ("hardware").

The processing module MT (or MT') is preferably embodied in the form of software modules. But, it is possible to envisage it being embodied in the form of a combination of software modules and electronic circuits, or indeed solely electronic circuits.

The invention is not limited to the embodiments of a device for generating sampled ramp signals, first and second devices for assisting the reconstruction of synchronization signals, and communication equipment described above, solely by way of example, but it encompasses all variants that may be envisaged by the person skilled in the art within the scope of the claims hereinbelow.

The invention claimed is:

1. A device for generating sampled ramp signals representative of synchronization signals, the device
   i) being devised to recover in received synchronization signals a reference clock signal and content pips, and to deliver first and second synchronous ramp signals representative of the number of ticks of the reference clock signal that have been delivered respectively since the last recovered content pip and since a last reference pip, each content pip triggering the setting to zero of the first ramp signal and each reference pip being defined when the number of zero settings of the first ramp signal is equal to a chosen threshold; and
   ii) comprising a sampler devised to sample the second ramp signal according to a sampling frequency so that the resulting samples are transmitted in frames of packet(s);
   wherein the sampler is furthermore devised to sample the first ramp signal according to the sampling frequency and to inter-associate the samples of the first ramp signal and the second ramp signal which correspond to the same sampling period so that the samples of the first ramp signal and the second ramp signal are transmitted in an associated manner in packet frames.

2. The device according to claim 1, wherein the sampler is devised to inter-associate the samples of the first ramp signal and the second ramp signal which correspond to the same sampling period so that the associated samples of the first ramp signal and the second ramp signal are integrated within the same packet.

3. The device according to claim 1, wherein the device comprises network interface module connected to an output of the sampler and devised to construct the packets of the frames to be transmitted.

4. An item of communication equipment for a packet switching communication network suitable for transmitting frames of packet(s), wherein the item of communication comprises a device for generating sampled ramp signals according to claim 1.

5. A device for assisting the reconstruction of synchronization signals, the device comprising:
   a phase-locked loop, devised to reconstruct on the basis of a second ramp signal transmitted by a remote item of equipment after sampling according to a chosen sampling frequency identical to, and in phase with, a local sampling frequency, a reference clock signal and then a reconstructed second ramp signal identical to, and in phase with, the second ramp signal before the sampling, the second ramp signal being synchronized with a first ramp signal representative of synchronization signals to be reconstructed, wherein the device furthermore comprises processing module devised:

to determine at least a value corresponding to a first sample of the second ramp signal received and a sampling period corresponding to the value, and then to deduce from the value an initialization value representative of a part of a reconstructed first ramp signal corresponding to the determined sampling period wherein the reconstructed first ramp signal is identical to, and in phase with the first ramp signal, and to initialize with the initialization value a synchronization counter, synchronized with respect to the reconstructed first ramp signal, on the basis of the reconstructed reference clock signal issued by the phased-lock loop.

6. The device according to claim 5, wherein the device comprises control module devised to define a reconstructed content pip during each zero setting of the synchronization counter and at least one auxiliary counter synchronous with the synchronization counter and whose current value is representative of chosen subsets of a content, in that the processing module are devised to deduce from the current value of the synchronization counter the corresponding value of the auxiliary counter, and to set to zero the value of the auxiliary counter when the current value of the synchronization counter corresponds to the maximum value that the auxiliary counter can take, and wherein reconstructed content pip then serves as starting instant for reconstructing the synchronization signal.

7. The device according to claim 6, wherein the device comprises generating module devised to reconstruct synchronization signals on the basis of the reconstructed content pips and/or defined synchronization pips and of the reconstructed reference clock signal.

8. A device for assisting the reconstruction of synchronization signals, the device comprising:

i) a phase-locked loop devised to reconstruct, on the basis of a second ramp signal transmitted by a remote item of equipment after sampling according to a chosen sampling frequency identical to, and in phase with, a local sampling frequency, a reference clock signal and a second ramp signal identical to, and in phase with, the transmitted second ramp signal, and ii) processing module devised to determine in a first ramp signal, transmitted by the remote item of equipment after sampling according to the sampling frequency, representative of a synchronization signal to be reconstructed, each sample of the first ramp signal is associated with a sample of the transmitted second ramp signal corresponding to a determinable sampling period, at least a value corresponding to a first sample of the first ramp signal received and a sampling period corresponding to the value, and then to initialize with the determined value a synchronization counter, synchronized with respect to a second reconstructed ramp signal, on the basis of a reconstructed reference clock signal issued by the phase-locked loop, wherein the second reconstructed ramp signal is identical to, and in phase with the second ramp signal.

9. The device according to claim 8, wherein the device comprises control module devised to define a reconstructed content pip during each zero setting of the synchronization counter and at least one auxiliary counter synchronous with the synchronization counter and whose current value is representative of chosen subsets of a content, in that the processing module is devised to deduce from the current value of the synchronization counter, the corresponding value of the auxiliary counter, and to set to zero the value of the auxiliary counter when the current value of the synchronization counter corresponds to the maximum value that the auxiliary counter can take, and in that the reconstructed content pip then serves as starting instant for reconstructing the synchronization signal.

10. The device according to claim 9, wherein the device comprises a generating module devised to reconstruct synchronization signals on the basis of the reconstructed content pips and/or defined synchronization pips and of the reference clock signal.

11. An item of communication equipment for a packet switching communication network suitable for receiving frames of packet(s), wherein the item comprises a device for assisting reconstruction of synchronization signals according to claim 5.

* * * * *